(12) United States Patent
Heineck et al.

(10) Patent No.: US 6,281,079 B1
(45) Date of Patent: Aug. 28, 2001

(54) MOS TRANSISTOR IN A SINGLE-TRANSISTOR MEMORY CELL HAVING A LOCALLY THICKENED GATE OXIDE, AND PRODUCTION PROCESS

(75) Inventors: Lars-Peter Heineck, Paris; Giorgio Schweeger, Draveil, both of (FR)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/272,968

(22) Filed: Mar. 19, 1999

(30) Foreign Application Priority Data

Mar. 19, 1998 (DE) .............................. 198 12 212

(51) Int. Cl.$^7$ ................................. H01L 21/336
(52) U.S. Cl. ...................... 438/264; 438/265; 438/594
(58) Field of Search ..................... 438/165, 199, 438/207, 262, 263, 264, 265, 773, 594; 257/321, 344

(56) References Cited

U.S. PATENT DOCUMENTS 5,306,655   4/1994   Kurimoto ............................ 438/302
5,360,758   11/1994  Bronner et al. ..................... 438/243
5,612,249 * 3/1997   Sun et al. .......................... 438/297
5,637,514 * 6/1997   Jeng et al. ......................... 438/163
5,798,550 * 8/1998   Kuroyanagi et al. ................. 257/341
6,015,736 * 1/2000   Luning et al. ...................... 438/264

* cited by examiner

*Primary Examiner*—Olik Chaudhuri
*Assistant Examiner*—Haoi Pham
(74) *Attorney, Agent, or Firm*—Herbert L. Lerner; Laurence A. Greenberg; Werner H. Stemer

(57) ABSTRACT

A MOS transistor in a single-transistor memory cell having a locally thickened gate oxide, and a process for producing the transistor. The MOS transistor can be used as a selection transistor in a single-transistor memory cell having nitride spacers, or another spacer material acting as an oxidation barrier. The transistor also has a bird's beak in the gate oxide to reduce leakage currents. The production process enables the bird's beak to be produced before the nitride spacers are produced. The MOS transistor can be used in a DRAM, particularly as a selection transistor.

8 Claims, 2 Drawing Sheets

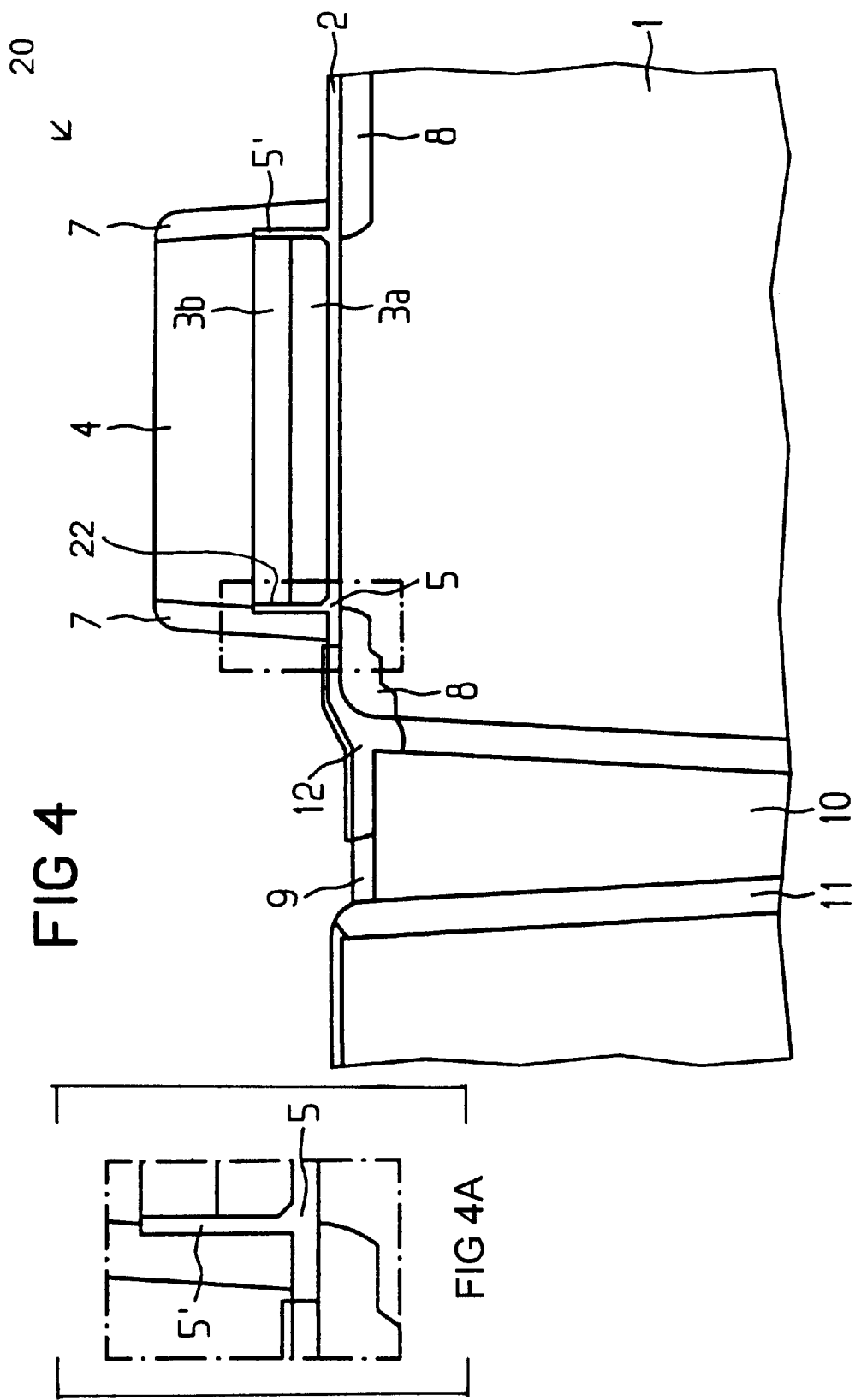

MOS TRANSISTOR IN A SINGLE-TRANSISTOR MEMORY CELL HAVING A LOCALLY THICKENED GATE OXIDE, AND PRODUCTION PROCESS

BACKGROUND OF THE INVENTION

FIELD OF THE INVENTION

The invention relates in general to the field of semiconductors, and specifically to a MOS transistor used as a selection transistor in a single-transistor memory cell, and to a production process.

MOS transistors form the basis of a large number of integrated circuits such as memory circuits or logic circuits. The growth in the integration density of integrated circuits requires that the gate length of the transistors be continually reduced. The gate length is the distance between the conductive regions of the MOS transistor, namely, the source and the drain. It is known in the prior art to provide the gate with nitride encapsulation. In particular, it is known to form the customary insulating spacers on the gate side walls from nitride in order to minimize the spacer thickness without detrimentally influencing the insulating effect. It is known that nitride spacers or a nitride etching stop layer on a top and a side gate insulation made of oxide, for example, can be used to produce a self-aligned contact with the source and the drain, in which the top and side gate insulation is not etched or attacked, or is etched or attacked only minimally.

The reduction in the gate length leads to increasing field strengths and hence to problems, particularly with the breakdown voltage and reliability of the transistor because of leakage currents.

Such a transistor having nitride encapsulation can be used, by way of example, as a selection transistor in a DRAM memory cell. There are a multiplicity of cell designs for DRAM memories. One example is a so-called trench cell with a surface strap. In this cell design, the storage capacitor is produced in a trench in the semiconductor substrate, and the storage electrode is configured in the trench. The capacitor dielectric covers the trench wall. The selection transistor is configured adjacent the trench. The electrical connection between the storage electrode and a doped region of the selection transistor is produced with a polysilicon structure (surface strap) that is configured on the substrate surface and overlaps the trench filler and the doped region.

With single-transistor memory cells, particularly DRAM memory cells, a leakage current results, in particular a current caused by the so-called GIDL effect (GIDL =Gate Induced Drain Leakage). A GIDL current causes the information retention time of the cell to be reduced. This applies particularly to the side of the selection transistor connected to the storage capacitor. Therefore, the GIDL current needs to be minimized.

One measure for reducing the GIDL effect is to reduce the diffusion of ion implantations below the gate. This is done by reducing the high-temperature steps after the critical implantations (implantation of source and drain). The associated additional process limitations are a considerable disadvantage. Another possibility is a complex, complete redesign of the module. However, both measures have limited effectiveness.

SUMMARY OF THE INVENTION

It is accordingly an object of the present invention to provide a MOS transistor in a single-transistor memory cell having an insulating spacer acting as an oxidation barrier, in which the GIDL effect is effectively minimized, as well as a production process for such a MOS transistor.

With the foregoing and other objects in view there is provided, in accordance with the invention, a MOS transistor in a single-transistor memory cell, comprising:

a semiconductor substrate having a substrate surface, a first conductive region and a second conductive region;

a gate oxide disposed on the substrate surface;

a gate disposed on the gate oxide over an area between the first conductive region and the second conductive region; and an insulating spacer disposed on the side wall of the gate, the spacer acting as an oxidation barrier;

the gate oxide insulating the gate from the semiconductor substrate and having a thickened area in a region below the side wall of the gate.

In accordance with an added feature of the invention, the insulating spacer is a silicon nitride spacer.

In accordance with an additional feature of the invention the gate includes a layer selected from the group consisting of a tungsten silicide layer and a polysilicon layer.

In accordance with another feature of the invention, the gate includes a tungsten silicide layer and a polysilicon layer.

In accordance with a further added feature of the invention, the gate includes a layer selected from the group consisting of a tungsten silicide layer and a polysilicon layer.

In accordance with a further additional feature of the invention, the gate includes a tungsten silicide layer and a polysilicon layer.

In accordance with yet another feature of the invention, the MOS transistor is a selection transistor in a DRAM memory cell.

With the objects of the invention in view, there is also provided a process for producing an MOS transistor in a semiconductor substrate which comprises:

producing a gate oxide on a semiconductor substrate;

producing a gate on the gate oxide, and producing the gate with a side wall;

forming a thickened area of the gate oxide below the side wall of the gate by performing an oxidation step;

subsequently, creating an oxidation barrier by forming an insulating spacer on the side wall of the gate; and producing doped regions adjacent the gate.

In accordance with an added mode of the invention, the oxidation step is performed at a temperature from 700° C. to 900° C.

In accordance with an additional mode of the invention, the oxidation step is a wet oxidation step.

In accordance with another mode of the invention, the oxidation step is performed at a temperature from 700° C. to 900° C., and is performed as a wet oxidation.

In accordance with a further added mode of the invention, after performing the oxidation step, LDD implantation is performed.

In accordance with a further additional mode of the invention, before performing the oxidation step, a passivation step to passivate the side wall of the gate is performed.

In accordance with yet an added mode of the invention, before performing the oxidation step, a passivation step at a high temperature is performed.

In accordance with yet an additional mode of the invention, before performing the oxidation step, a passivation step at a temperature from 1000° C. to 1150° C. is performed.

In accordance with yet another mode of the invention, the gate is produced with a tungsten silicide layer.

The use of a bird's beak in a MOS transistor for reducing the hot-electron effect is disclosed, for example, in U.S. Pat. No. 5,306,655. The transistors described there are insulated at the side by oxide spacers.

The invention is based on providing a thickened area in the gate oxide in the region below a side wall of the gate, i.e. a so-called bird's beak, in a MOS transistor in a single-transistor memory cell having an insulating spacer acting as an oxidation barrier. The production process enables the thickened area of the gate oxide to be produced before the insulating spacers are produced. After the gate has been etched, an oxidation step is performed which produces a thickened area in the gate oxide below the side wall of the gate. After this, an insulating spacer is produced on the side wall of the gate. The spacer is made of nitride or another material acting as an oxidation barrier. Finally, the MOS transistor is finished using known methods (particularly by implantation of the doped regions).

The lateral oxidation component necessary for forming the bird's beak is produced by selecting suitable process conditions. For example a relatively low oxidation temperature in the range from 700 to 900° C. is used, with a preferred temperature of around 800° C. Wet oxidation can additionally or alternatively be used by adding hydrogen or a hydrogen compound for at least part of the oxidation step.

In order to prevent undersirable excessive oxidation of the gate tracks themselves, it is advantageous, depending on the material of the gate, to passivate the exposed side wall appropriately prior to the oxidation step. To do this, it is possible to use a short high-temperature step, for example, possibly with the addition of oxygen. The preferred temperature range is 1000° C. to 1150° C. Alternatively, the passivation can be accomplished by the deposition of oxide which is then tempered at a high temperature in a nitrogen-containing atmosphere before the bird's beak is produced. The extent to which passivation is necessary depends, in particular, on the gate material. In the case of gates made solely of polysilicon, it is possible to dispense with passivation. A gate that includes a tungsten silicide layer generally requires passivation. The gate can be designed as a multilayer gate stack.

The process illustrated is used to produce a bird's beak on both sides of the gate. Alternatively, by suitably modifying the process (covering one side of the gate), it is possible to produce a bird's beak on only one side of the gate.

Cleaning steps may be carried out prior to the oxidation step.

The process can also be used to produce an LDD transistor in that LDD implantation is performed after the oxidation step and before the insulating spacer is produced.

Other features which are considered as characteristic for the invention are set forth in the appended claims.

Although the invention is illustrated and described herein as embodied in a MOS transistor in a single-transistor memory cell having a locally thickened gate oxide, and production process, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 4 is a cross section of a second embodiment of the invention illustrating a DRAM memory cell with a MOS selection transistor produced according to the invention; and FIG. 4a is a partial view of FIG. 4.

DESCRIPTION OF THE PREFERRED EMBODIMENTS

Figure 1:
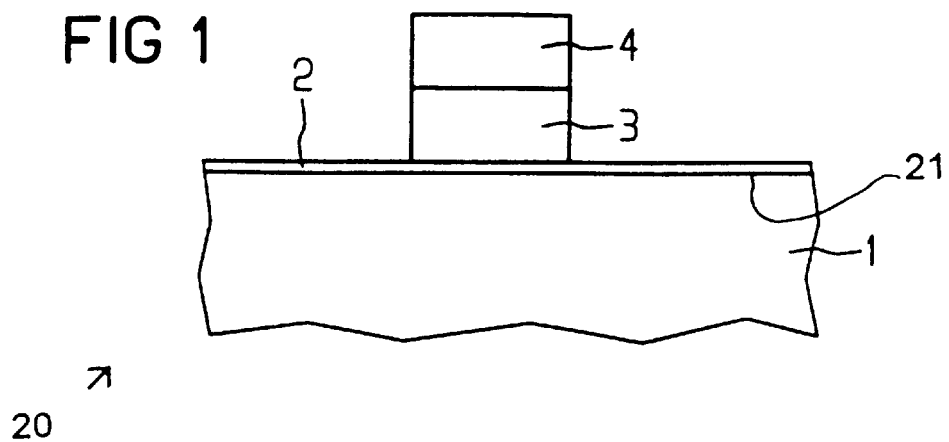
FIG. 1 is a cross section of a preliminary form of a first embodiment of a MOS transistor.
Figure 2:
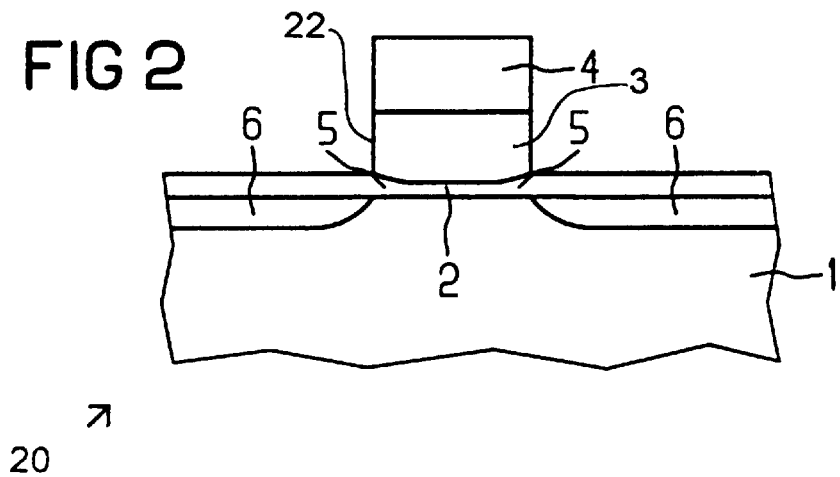
FIG. 2 is a cross section of a preliminary form of the first embodiment of the MOS transistor after an oxidation process.
Figure 3:
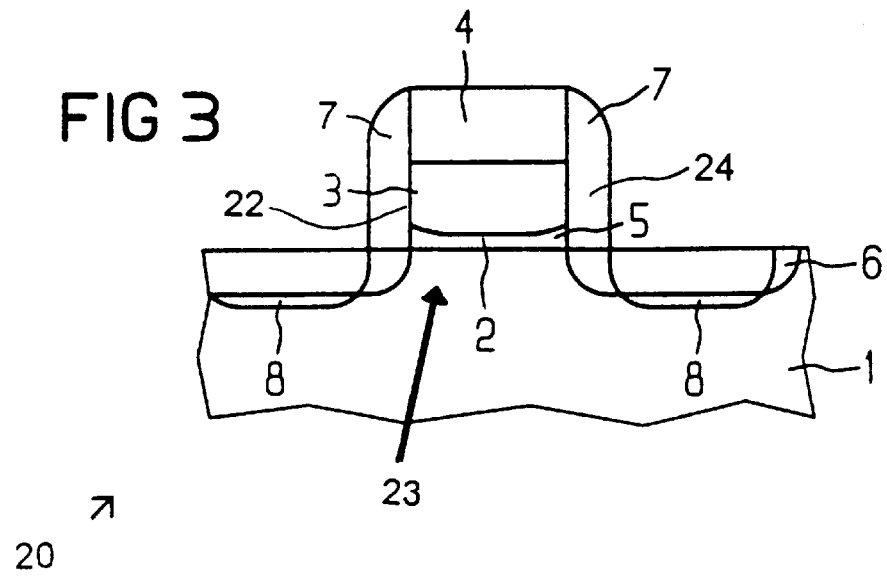
FIG. 3 is a cross section of the first embodiment of the MOS transistor with spacers acting as an oxide barrier, and doped regions forming a source and a drain.

FIGS. 1–3 illustrate the production of a first embodiment of a MOS transistor 20. FIG. 1 shows a cross section of a preliminary form of an MOS transistor 20 having a gate oxide 2, a gate 3, for example made of polysilicon, and an insulating gate cover 4 which are produced on a substrate surface 21 of a semiconductor substrate 1 using known processes. In this exemplary embodiment, the gate cover 4 is made of nitride. The gate oxide 2 generally remains on the substrate surface 21 outside the region covered by the gate 3.

In addition, the substrate 1 comprises (as shown in FIG. 4) a trench capacitor whose storage electrode is to be connected to the transistor 20.

FIG. 2 shows a cross section of a preliminary form of a MOS transistor 20 after an oxidation process has been performed. The oxidation process is performed after any cleaning steps. One example of the oxidation process includes:

slowly raising the temperature (e.g. 5° /min.) to 800° C.;

then, at a temperature of 800° C., introducing 6.0 l/min. of $O_2$ for 10 min.;

then, at a temperature of 800° C., introducing 6.0 l/min. of $O_2$ and 3.6 l/min. of $H_2$ for 7 min.;

then, at a temperature of 800° C., introducing 6.0 l/min. of $O_2$ for 5 min.;

then, at a temperature of 800° C., introducing 20.0 l/min. Of $O_2$; and then, $N_2$ purging and lowering the temperature.

This produces a bird's beak 5 or a thickened area of the gate oxide 2 in the region below the side wall 22 of the gate 3. It is possible to vary the lateral extent of the bird's beak 5 by varying the process parameters and the oxidation time. LDD implantation may be performed using a dopant having a conduction type opposite from that of the substrate 1, so that LDD regions 6 are produced in the substrate 1. Depending on the gate material, it may be advantageous or necessary to perform a passivation process prior to the oxidation process, such as that described in more detail in the second exemplary embodiment.

FIG. 3 shows a cross section of the first embodiment of the MOS transistor after the formation of insulating spacers 7 and doped regions 8 which form a source and a drain. On each side wall 22 of the gate 3 (or on only one side wall), an insulating spacer 7 made of a material acting as an oxidation barrier 24 is produced. The insulating spacers 7 can be made of nitride by utilizing known processes. The MOS transistor 20 is finished by producing the doped regions 8 forming the source and the drain. It is seen that the gate 3 is disposed on the gate oxide 2 over an area 23 between the first conductive or doped region 8 and the second conductive or doped region 8.

FIG. 4 shows a cross section of a second embodiment of the invention illustrating a DRAM memory cell with an MOS selection transistor 20. Features of the secomd embodiment that are similar to the features shown in the first embodiment are referred to using the same reference numerals. The cross section shows a detail of a DRAM trench cell having a trench, filled up with polysilicon 10, in the substrate 1. FIG. 4a shows an enlarged detail of the side wall 22 of the gate (3a 3b). The trench is produced by known methods using a trench mask. The trench wall is covered with an insulation layer 11, and then the trench is filled with doped polysilicon 10 that functions as a storage electrode. In many cases (not illustrated here), the insulation layer 11 is thicker in the upper region of the trench (so-called oxide collar) than in the lower region, where it forms the actual capacitor dielectric. The trench is covere at the substrate surface with an insulation material 9 which is preferably produced at the same time as insulation regions between adjacent memory cells (e.g. shallow trench isolation). Next, the gate oxide 2 and the gate (3a and 3b) are formed. The gate is designed as a multilayer gate stack made of polysilicon 3a and tungsten silicide 3b. The insulating gate cover 4 is made entirely or partially of silicon nitride. Up to this point, production can be carried out using customary processes.

Next, a passivation process is performed which produces a thin oxide layer 5' on the side walls 22 of the gate (3a and 3b). The passivation process preferably comprises the following steps:

raising the temperature at 20° C./s up to 1090° C. in $N_2$ introduced at a rate of 5 l/min.;

at a temperature of 1090° C., introducing 5.0 l/min. of $N_2$ for 10 sec.;

at a temperature of 1090° C., introducing 4.8 l/min. of $N_2$ and 0.3 l/min. of $O_2$ for 5 sec.;

at a temperature of 1090° C., introducing 1.3 l/min. of $N_2$ and 4.0 l/min. of $O_2$ for 12 sec.;

at a temperature of 1090° C., introducing 5.0 l/min. of $O_2$ for 33 sec.; and lowering the temperature under $O_2$.

The parameters may be varied here. A slow transition from $N_2$ to $O_2$ is advantageous, however, the times can be chosen depending on the installation used. After the side walls 22 of the gate (3a and 3b) have been passivated by the thin oxide layer 5', the oxidation process can be carried out as described above to produce the bird's beak 5.

Next, known processes are used to form nitride spacers 7 on the side wall 22 of the gate (3a and 3b). Implantation of the source and the drain can take place beforehand and/or afterwards, and in particular, LDD transistors can be formed. When the selection transistor 20 has been finished, the insulation layer 9 at the top of the trench is etched away locally, and a so-called surface strap 12 is produced to electrically connect the selection transistor 20 and the storage electrode 10. This is preferably done by depositing an undoped silicon layer which is doped over the opening in the insulation layer 9 by outdiffusion from the storage electrode 10. After this, the remaining undoped silicon can be removed selectively to leave the doped silicon 12. Finally, the surface of the surface strap 12 is oxidized, so that the surface strap 12 is insulated at the top. The nitride spacer 7 insures that no further oxidation of the gate oxide takes place.

The invention can also be used for other DRAM memory designs, for example with a buried strap as in U.S. Pat. No. 5,360,758. The use of the bird's beak 5 is associated with substantial advantages for DRAMs because, in this case, even small leakage currents are quite critical.

We claim:

1. A process for producing an MOS transistor in a semiconductor substrate which comprises:

producing a gate oxide on a surface of a semiconductor substrate;

producing a gate on the gate oxide, and producing the gate with a side wall;

performing a passivation step to passivate the side wall of the gate;

subsequently, forming a thickened area of the gate oxide below the side wall of the gate by performing an oxidation step;

subsequently, creating an oxidation barrier by forming a nitride spacer on the side wall of the gate; and producing doped regions adjacent the gate and adjacent the surface of the semiconductor and which form a source region and a drain region of an MOS-transistor.

2. The process according to claim 1, wherein the oxidation step is performed at a temperature from 700° C. to 900° C.

3. The process according to claim 1, wherein the oxidation step is a wet oxidation step.

4. The process according to claim 1, wherein the oxidation step is performed at a temperature from 700° C. to 900° C., and is performed as a wet oxidation.

5. The process according to claim 1, which comprises, after performing the oxidation step, performing LDD implantation.

6. The process according to claim 1, which comprises performing the passivation step at a temperature of at least 1000° C.

7. The process according to claim 1, which comprises performing the passivation step at a temperature from 1000° C. to 1150° C.

8. The process according to claim 1, which comprises, producing the gate with a tungsten silicide layer.

* * * * *